United States Patent [19]

Jenkinson et al.

[11] 4,143,013
[45] Mar. 6, 1979

[54] RADIATION CURABLE COATING COMPOSITIONS

[75] Inventors: Richard D. Jenkinson, St. Albans; Charles H. Carder, Amma, both of W. Va.

[73] Assignee: Union Carbide Corporation, New York, N.Y.

[21] Appl. No.: 880,121

[22] Filed: Feb. 22, 1978

[51] Int. Cl.$^2$ .............................. C08L 33/08
[52] U.S. Cl. .................. 260/29.1 SB; 204/159.16; 204/159.22; 204/159.23
[58] Field of Search .............. 260/29.1 SB; 204/159.16, 159.22, 159.23

[56] References Cited

U.S. PATENT DOCUMENTS

| 3,850,770 | 11/1974 | Juna et al. | 204/159.16 |
| 3,940,360 | 2/1976 | Carder | 260/29.1 SB |
| 4,028,300 | 6/1977 | Wake et al. | 260/31.2 R |
| 4,049,634 | 9/1977 | Ko et al. | 204/159.22 |

Primary Examiner—Lewis T. Jacobs
Attorney, Agent, or Firm—Francis M. Fazio

[57] ABSTRACT

Tetraethylorthosilicate or tetraethoxyethylorthosilicate is employed as a low-toxicity diluent in radiation curable coating compositions containing acrylyl or methacrylyl functional oligomer. The orthosilicate compound imparts improved leveling and surface characteristics to said coating compositions.

12 Claims, No Drawings

RADIATION CURABLE COATING COMPOSITIONS

BACKGROUND OF THE INVENTION

Increasing restrictions on the amount and types of volatiles which may be released in work environments and the desire to reduce energy consumption have prompted the development of radiation curable coating compositions which are essentially free of volatile solvents that must be evaporated during the curing of the composition. These solvent-free coating compositions are known as 100 percent reactive systems; that is, each component of the composition reacts and becomes incorporated into the cured coating when the composition is exposed to radiation.

The radiation curable coating compositions of the prior art typically contain a radiation reactive oligomer or resin; a radiation reactive diluent; a photoinitiator; and, optionally, a radiation reactive crosslinker. The radiation reactive diluent serves the function of reducing the viscosity of the oligomer or resin in order that the composition, in the uncured state, has a viscosity such that it can easily be applied as a film to a substrate using conventional techniques of the coatings art.

Virtually any monomer or oligomer which can be polymerized by a conventional thermally initiated polymerization reaction can be employed as one of the radiation reactive components of the prior art. From a commercial standpoint, however, compounds containing acrylyl or methacrylyl groups have become by far the most widely used components of radiation curable coating compositions because of the ease and rapidity with which the acrylyl or methacrylyl groups undergo radiation-induced polymerization. Monofunctional monomeric acrylate or methacrylate esters are generally employed as the radiation reactive diluent; monomeric polyfunctional acrylate or methacrylate esters are employed as the crosslinking agent; and oligomers or resins containing one or more acrylyl or methacrylyl groups are employed as the oligomer or resin component.

The acrylyl or methacrylyl oligomer or resin component can be chosen from among many different types. From the standpoint of producing a coating having good physical properties in the cured state, one of the most widely used types of oligomer or resin is a urethane oligomer or resin which is characterized in that it contains at least one urethane linkage and an average of at least one acrylyl or methacrylyl group per molecule.

While the acrylyl or methacrylyl bearing compounds which have been widely employed in radiation curable coating compositions are excellent in terms of their radiation responsiveness, and they produce cured coatings having good physical properties, their use requires that special precautionary procedures be followed to prevent workers from coming in contact with some of the materials or their vapors due to the generally high levels of toxicity associated with the materials. This is most especially true of the monomeric acrylate or methacrylate diluent component, since it is usually the lowest molecular weight component and therefore the most likely component to produce vapors. Moreover, when the cured coatings are to be employed in applications where they are to come in contact with the skin, even a small amount of residual unreacted acrylyl or methacrylyl monomer being present in the cured coating is a hazard, since unreacted monomer can migrate to the coating surface. One can mention, as typical of the compounds which have been employed as the monomeric acrylate or methacrylate diluent component, 2-hydroxyethyl acrylate, glycidyl acrylate, 2-phenoxyethyl acrylate, 2-methoxyethyl acrylate, 2-ethylhexyl acrylate, isodecyl acrylate, 2-(N-methylcarbamoyloxy) ethyl acrylate, dicyclopentyl acrylate, and the like, or the corresponding methacrylates.

The radiation curable coatings art is desirous of finding a low toxicity diluent component which can be employed partially or completely in lieu of the monomeric acrylate or methacrylate compounds of prior art compositions. To be commercially practical, such a component should be an efficient viscosity reducing agent in admixture with the other components of the composition; should not create toxic vapors or migrate out of the cured coating; and should not significantly increase cure time.

SUMMARY OF THE INVENTION

The present invention provides a low-toxicity diluent component for radiation curable coating compositions that contain an acrylyl or methacrylyl oligomer or resin component auch as an acrylyl urethane oligomer. The low-toxicity diluent component of this invention is chosen from the group consisting of tetraethylorthosilicate and tetraethoxyethylorthosilicate.

When the orthosilicate compound is employed as a diluent component as described herein, certain benefits in addition to viscosity reduction, may be realized, to wit, the application characteristics of the uncured coatings composition, such as flowability, leveling, and smoothness, are notably improved. Upon curing by exposure to actinic radiation, the coating composition forms a solid, non-tacky surface free of pits, fissures or other surface irregularities.

While there is no readily apparent reactive mechanism by which the orthosilicate becomes chemically bonded to the cured coating, it is believed that at least a substantial portion of the orthosilicate becomes permanently incorporated into the cured coating as an integral, non-migratory part thereof. The presence of silicon in the cured coating has been confirmed by scanning electron microscopy.

DETAILED DESCRIPTION OF THE INVENTION

The radiation curable coating composition in which the orthosilicate compound is employed as a diluent component contains an acrylyl or methacrylyl bearing oligomer or resin which cn be any of the known useful radiation reactive oligomers or resins containing at least one acrylyl or methacrylyl group. The acrylyl or methacrylyl bearing component shall hereinafter be referred to as the "acrylyl oligomer" even though it includes materials which have characteristics such that they might more strictly be termed "polymers" or "resins." The term "oligomer" is employed to connote that the material, as it is employed in the uncured composition, is intended for polymerization to a higher molecular weight in the final cured coating. The useful acrylyl oligomers generally have a molecular weight of at least about 400 and, usually from about 1,000 to 10,000, although the molecular weight is not critical to the practice of this invention.

Many radiation curable acrylyl oligomers are known in the art and no attempt will be made to enumerate them all herein. However, one can mention as illustrative of suitable acrylyl oligomers the acrylic acid or methacrylic acid esters of epoxidized fatty oils such as linseed, soybean, cottonseed or hempseed oil, such as those disclosed in U.S. Pat. Nos. 3,125,592; 3,224,989; and 3,256,225; compounds obtained by first reacting a dicarboxylic acid anhydride with hydroxyalkyl(meth)acrylate to form a half ester and then reacting the half ester with glycidyl acrylate, such as those described in U.S. Pat. No. 3,785,849; polyester oligoacrylates obtained by reacting a polybasic acid with a polyhydric alcohol and a reactive acrylyl compound, such as those described in U.S. Pat. No. 4,001,097; urethane acrylyl oligomers containing at least one urethane group (i.e.

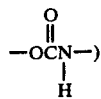

in the molecule.

The urethane acrylyl oligomers are widely employed in radiation curable compositions and many urethane acrylyl oligomers are disclosed.

Typically, the urethane acrylyl oligomer is prepared by reacting a mixture of one or more hydroxyl-bearing compounds and one or more organic polyisocyanates, wherein at least one of the hydroxyl-bearing compounds has, in addition to its hydroxyl functionality, one or more acrylyl or methacrylyl groups. Usually, at least one of the hydroxyl-bearing reactants is an oligomeric or polymeric organic polyol so that the desired molecular weight can be achieved in the urethane acrylyl oligomer. The oligomeric or polymeric organic polyols can be, for example, polyether polyols, e.g. polyoxyethylene polyols, polyoxypropylene polyols, etc.; polylactone polyols, e.g. poly-epsilon-caprolactone or any of the organic polycaprolactone polyols described in U.S. Pat. No. 3,169,945; polyester polyols such as the polyadipates; or any of the other known useful organic polyols. The oligomeric or polymeric organic polyol can be converted to an acrylyl or methacrylyl bearing polyol reactant by reacting it with acrylic or methacrylic acid, with the polyol being employed in stoichiometric excess to insure the presence of free hydroxyl groups in the reaction product. The acrylated or methacrylated organic polyol thus produced can be reacted with an organic polyisocyanate to produce the urethane acrylyl oligomer useful in the improved compositions of this invention.

Alternatively, the urethane acrylyl oligomer can be obtained by reacting a mixture of an organic polyisocyanate, an oligomeric or polymeric organic polyol and a monomeric hydroxyacrylate or hydroxymethacrylate compound such as 2-hydroxyethyl acrylate, 2-hydroxyethyl methacrylate, 2-hydroxypropyl acrylate, 2-hydroxypropyl methacrylate, trimethylol propane dimethacrylate, trimethylol propane monomethacrylate, pentaerythritol tri-, di-, or mono-acrylate, pentaerythritol tri-, di-, or mono-methacrylate, and the like.

Yet another method by which the urethane acrylyl oligomer can be produced is by: (a) producing an isocyanate-terminated polyurethane prepolymer by reacting a stoichiometric excess of an organic polyisocyanate with an organic polyol; then (b) reacting the isocyanate-terminated polyurethane prepolymer obtained in step (a) with a hydroxyacrylate or hydroxymethacrylate compound, such as 2-hydroxyethyl acrylate, 2-hydroxyethyl methacrylate, 2-hydroxypropyl acrylate, 2-hydroxypropyl methacrylate, etc.

Suitable urethane acrylyl oligomers are described and illustrated in much greater detail in U.S. Pat. Nos. 3,782,961; 3,700,643; 3,954,584; 3,297,745; and 3,891,523.

The above described methods of producing the urethane acrylyl oligomer component are presented as illustrative only and any other urethane acrylyl oligomers known in the art may be employed in the improved radiation curable coating compositions of this invention. The selection of a particular acrylyl oligomer does not constitute the invention herein.

In addition to the orthosilicate compound and the acrylyl oligomer, the improved radiation curable coating compositions of this invention can, if desired, contain a radiation reactive crosslinking agent. The suitable cross-linking agents are known to those skilled in the art and generally are chosen from the low molecular weight polyfunctional acrylate or methacrylate esters. By "low molecular weight" in this context is meant that the polyfunctional acrylate or methacrylate esters usually have average molecular weights which do not exceed about 1,200. While there is no strict lower limit on the molecular weight of the polyfunctional acrylate or methacrylate ester crosslinker, this component usually has a molecular weight of at least about 168.

The low molecular weight polyfunctional acrylate or methacrylate esters are any of the di-, tri-, or tetra-acrylate esters of acrylic acid or methacrylic acid with the di-, tri-, or tetra-alcohols. One can mention, as being merely illustrative thereof, neopentyl glycol diacrylate, 3-acryloxy-2', 2'-dimethyl-propyl 3-acryloxy-2, 2-dimethylpropionate, 1,6-hexanediol diacrylate, pentaerythritol triacrylate, ethylene glycol diacrylate, diethylene glycol diacrylate, trimethylol propane triacrylate, penaerythritol triacrylate, and the like, the reaction product of 2 moles of a hydroxyalkyl, acrylate, e.g. 2-hydroxyethyl acrylate, and 1 mole of an organic diisocyanate, or the corresponding methacrylates.

The concentration of acrylyl oligomer and low molecular weight polyfunctional acrylate or methacrylate which can be suitably employed in the radiation curable coating compositions are known to those skilled in the art and any such composition containing an acrylyl oligomer can advantageously employ the tetraethylorthosilicate or tetraethoxyethylorthosilicate as a diluent. Typically, the coating compositions contain from about 30 to about 95 weight percent of the acrylyl oligomer and from 0 to about 50 weight percent of the low molecular weight polyfunctional acrylate or methacrylate crosslinker.

When the coating composition is to be cured by exposure to non-ionizing radiation, e.g. ultraviolet, there is present in the composition a photoinitiator, which can be present at a concentration of up to about 10 weight percent of the radiation curable composition, and is preferably present at a concentration of from 1 to 5 weight percent thereof. The suitable photoinitiators are well known in the art. One can mention, as illustrative thereof 2,2-diethoxyacetophenone, 2- or 3- or 4-bromoacetophenone, 3- or 4-bromoacetophenone, benzoin, the allyl benzoin ethers, benzophenone, benzoquinone, 1-chloroanthraquinone, p-diacetyl-benzene, 9,10-dibromoanthracene, 9,10-dichloroanthracene, 4,4-dichlorobenzophenone, 1,3-diphenyl-2-propanone, 1,4-naphthyl-phenyl ketone, 2,3-pentanedione, propiophenone, chlorothioxanthone, xanthone and the like, or a mixture of these.

Those skilled in the art of photochemistry are fully aware that so-called "photoactivators" or "photosynergists" can be used in combination with the aforementioned photoinitiators and that synergistic effects are sometimes achieved when such combinations are used. Photoactivators are well known to those skilled in the art and require no further description herein for them to know what they are. Nonetheless, one can mention as illustrative of suitable photoactivators, methylamine, tributylamine, N-methyldiethanolamine, 2-aminoethylethanolamine, allylamine, cyclohexylamine, diphenylamine, ditolylamine, trixylylamine, tribenzylamine, n-cyclohexylethylenimine, piperadine, N-methylpiperazine, 2,2-dimethyl-1,3-bis-(3-N-morpholinyl)propionyloxy propane, and the like, or any mixture of these. The photoactivators, when used, are employed in the usual effective amounts which are known to those skilled in the art (see, e.g., U.S. Pat. No. 3,795,807).

The tetraethylorthosilicate or tetraethoxyethylorthosilicate or mixture thereof is present in the improved radiation curable coating compositions of this invention at a concentration of from 1 to 50 weight percent, preferably from 1 to 15 weight percent thereof. The exact amount to be employed in a given composition is largely determined by the viscosity desired in the uncured coating composition and the viscosities and concentrations of the other components employed, particularly the acrylyl oligomer component. It is well within the ability of the average skilled worker in the art to determine, without undue experimentation, the specific amount of the orthosilicate which is necessary in a given composition to produce the desired viscosity.

If one desires, the orthosilicate diluent can be employed in conjunction with a liquid monofunctional acrylate diluent. It is to be understood that the primary benefit obtained by the use of the orthosilicate compound in accordance with the teachings of this invention is to reduce reliance on monofunctional acrylates or methacrylates as diluents. At the same time, however, it may be desirable to have a small amount of liquid monofunctional acrylate or methacrylate present, insofar as the monofunctional acrylate or methacrylate may, in some instances, impart desirable physical properties to the cured coating. In any case, the orthosilicate diluent reduces the amount of liquid monofunctional acrylate necessary to produce the desired viscosity in the uncured coating composition. By reducing the concentration of liquid monofunctional acrylate in the coating composition, one reduces the toxicity hazard.

A class of liquid monofunctional acrylate monomers which have been found to impart a degree of hardness and abrasion resistance to the cured coatings are the carbamoyloxy alkyl acrylates, which can be N-monoalkyl substituted. Examples of the carbamoyloxy alkyl acrylates are N-methyl carbamoyloxy methyl acrylate, N-ethyl carbamoyloxy methyl acrylate, 2-carbamoyloxy ethyl acrylate, 2-(N-methyl carbamoyloxy) ethyl acrylate, 2-(N-ethyl carbamoyloxy) ethyl acrylate, 2-carbamoyloxy propyl acrylate, and the like, or the corresponding methacrylates.

Less preferred liquid monofunctional acrylates which can be present in the improved radiation curable coating compositions are those defined by the formula:

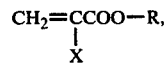

wherein X is hydrogen or methyl and R can be unsubstituted or substituted alkyl, cycloalkyl, alkenyl, aryl, or aralkyl, wherein the substituent can be alkoxy, hydroxy, cyano, phenoxy or amino; all of which are well known in the art.

One can mention, as illustrative of such compounds: alkyl acrylates having up to about 12 carbons in the alkyl segment such as ethyl acrylate, butyl acrylate, 2-ethylhexyl acrylate, amyl acrylate, n-lauryl acrylate, nonyl acrylate, n-octyl acrylate, isooctyl acrylate, isodecyl acrylate and the like; alkoxy alkyl acrylates such as methoxybutyl acrylate, ethoxyethyl acrylate, ethoxypropyl acrylate, and the like; hydroxyalkyl acrylates such as hydroxyethyl acrylate, hydroxybutyl acrylate and the like; alkenyl acrylates, such as trimethoxyallyloxymethyl acrylate and allyl acrylate; aralkyl acrylates such as phenoxyethyl acrylate and benzyl acrylate; cycloalkyl acrylates such as cyclohexyl acrylate, cyclopentyl acrylate and isobornyl acrylate; aminoalkylacrylates such as diethylaminoethyl acrylate; cyanoalkyl acrylates such as cyanoethyl acrylate and cyanopropyl acrylate; and the corresponding methacrylate.

If desired, the liquid monofunctional acrylate can be present in the coating composition in amounts up to about 40 weight percent thereof.

In addition to the foregoing components, the improved radiation curable coating compositions of this invention can also contain conventional additives such as pigments, wetting agents, flatting agents, etc., which are employed in the usual known effective concentration.

The acrylyl oligomer, tetraethylorthosilicate or tetraethoxyorthosilicates, and other components if present, are admixed in any manner suitable for achieving a homogeneous composition to produce the improved radiation curable coating compositions of this invention.

The improved radiation curable coating composition can be applied to a substrate by any conventional means of the coatings are, including spray, curtain coating, roll coating, brushing and doctor knife techniques.

The applied radiation curable coating composition can be cured by any of the known radiation curing methods such as exposure to ultraviolet light, x-rays, alpha particles, electron beam, or gamma rays. Irradiation can be performed using any of the known and commonly available types of radiation curing equipment, for example, curing may be done by low, medium or high pressure mercury arc lamps or with a swirlflow plasma arc radiation source by the process disclosed in U.S. Pat. No. 3,650,699. Curing can be carried out in air or in an inert atmosphere such as nitrogen or argon. Exposure time required to cure the composition varies somewhat depending on the specific formulation, type and wavelength of radiation, energy flux, concentration of photoinitiator, and film thickness. Those skilled in the art of radiation technology will be able to determine the proper curing time for any particular composition. Generally, the cure time is rather short, that is, less than about 20 seconds.

While not all of the orthosilicate is necessarily incorporated into the cured coating, any of the orthosilicate which may escape into the surrounding environment during application and curing of the coating composition does not represent a significant toxicity hazard. As previously mentioned, at least a substantial portion of the orthosilicate becomes incorporated into the cured coating. When cured coatings containing the orthosilicates were exposed to boiling water no "blush" was subsequently observed in the coating, indicating that the orthosilicate did not migrate.

The following examples are presented in order to further illustrate the invention herein and are not intended to limit its scope.

In the examples the following test procedures were employed:

Scrub test — 10 ml. of a 5% aqueous solution of an abrasive household cleanser were placed on the specimen. A scrub brush (Gardner No. WG-2000-NB) carrying a 170 gram weight was drawn across the sample in a straight line for 250 cycles. Gloss of the sample (60° Gardner glossmeter) was measured before and after scrubbing and results reported as percent decrease in 60° gloss value.

Frick Taper abrasion test—Standard Taber abrasion resistance test modified by continuously feeding a stream of 240 mesh alumina grit onto the surface of the sample and rotating the sample under a pair of leather covered abrading wheels (1,000 gram load). Grit is continuously removed from surface after completion of one revolution. Results are reported as grams/1,000 cycles of speciment lost.

The "oligomer/crosslinker" employed in several of the examples was a mixture of:
(a) 85 weight percent of a urethane acrylyl oligomer obtained by reacting 1 mol. part of a difunctional poly-epsilon-caprolactone polyol (average OH No. 212, average m. wt. 530) with 1 mol. part isophorone diisocyanate and then reacting the product thus obtained with 1 mol. part of 2-hydroxyethyl acrylate; and
(b) 15 weight percent of the product of reaction of 2 mol. parts of 2-hydroxyethyl acrylate and 1 mol. part of isophorone diisocyanate.

The "silicone slip additive" employed in several of the examples had the formula:

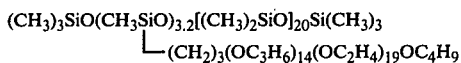

The designation MCEA is used in lieu of the more complete nomenclature for 2-(N-methylcarbamoyloxy)ethyl acrylate.

EXAMPLE 1

A radiation curable coating composition was prepared by mixing to a uniform consistency a composition consisting of 68.9 weight percent oligomer/crosslinker; 22.1 weight percent 2-hydroxyethyl acrylate, 8.3 weight percent 2-ethylhexyl acrylate; 0.7 weight percent 2,2-diethoxyacetophenone; and adding thereto 1 weight percent, based on the weight of the composition, of silicone slip additive. To three portions of the radiation curable coating composition there were added 1, 2, and 3 parts per hundred of tetraethylorthosilicate to determine its effect on viscosity. Results are reported below.

| TEOS (p.p.h.) | Brookfield viscosity (cps. at 23° C.) |
|---|---|
| 0 | 820 |
| 1 | 770 |
| 2 | 660 |
| 3 | 610 |

TEOS - Tetraethylorthosilicate

EXAMPLE 2

Using an air stirrer, a radiation curable coating composition was prepared by mixing 125 grams of oligomer/crosslinker and 1 gram of 2,2-diethoxyacetophenone. A second radiation curable coating composition was prepared by mixing 125 grams of oligomer/crosslinker, 1 gram of 2,2-diethoxyacetophenone, and 20 grams of tetraethylorthosilicate. The composition without tetraethylorthosilicate had a Brookfield viscosity of 930 cps. at 25° C., while the composition containing the tetraethylorthosilicate had a Brookfield viscosity of 600 cps. at 25° C.

A portion of the coating which contained the tetraethylorthosilicate was applied to a #37 Bonderite steel panel at a film thickness of 0.25 mils using a No. 3 wire wound rod (this applied coating is identified as sample A). A second portion of the coating composition containing the tetraethylorthosilicate was applied to a Bonderite #37 steel panel at a film thickness of 2.5 mils using a Baker Knife (this applied coating is identified as Sample B). As a control, a portion of the coating composition without the tetraethylorthosilicate was applied to a Bonderite #37 steel panel at a film thickness of 0.25 mils using a No. 3 wire wound rod. Each of the coating compositions on the steel panels was cured by 2.0 seconds of exposure to medium pressure mercury arc lamps which delivered ultraviolet light at a flux of 2,500 watts/sq. ft. under 10 p.s.i. nitrogen blanketing. Mechanical properties of the cured films are given below

| Sample | Stiffness Modulus, p.s.i. | Tensile Strength, p.s.i. | Elongation, % |
|---|---|---|---|
| Control | 18,200 | 2,500 | 46 |
| A | 29,800 | 2,000 | 51 |
| B | 9,800 | 2,000 | 43 |

EXAMPLE 3

To each of 4 portions of the radiation curable coating composition used in Example 1, there were added varying amounts of tetraethylorthosilicate as indicated in the table below. Each coating composition was mixed with a high speed stirrer, applied to stainless steel plated at 2-mil film thicknesses, and radiation cured in a manner similar to that of Example 2. The cured films were removed from the plates and sections of the films were tested for mechanical properties after 5 days aging both at room temperature and at 65° C. in a hot air oven. It can be seen that the presence of tetraethylorthosilicate as a diluent had little effect on the ultimate properties of the cured coatings. In fact, the tensile strengths of the samples containing tetraethylorthosilicate were in all cases greater than the comparable cured samples containing no tetraethylorthosilicate.

| Sample | 1 | 2 | 3 | 4 | 5 |
|---|---|---|---|---|---|
| Tetraethylorthosilicate, p.p.h. of coating | 0 | 2 | 4 | 6 | 10 |

| | -continued | | |
|---|---|---|---|
| C | 1,381 | 99 | 780 |

EXAMPLES 5-8

In each of these examples, a conventional radiation curable coating composition is compared with a similar composition in which a portion of the monomeric monofunctional acrylate has been substituted by tetraethylorthosilicate.

Example 5

| Formulation | Weight percent | | |
|---|---|---|---|
| | A | B | C |
| Urethane acrylyl oligomer* | 60 | 60 | 60 |
| MCEA | 39 | 29 | 24 |
| Tetraethylorthosilicate | — | 10 | 15 |
| 2,2-diethoxyacetophenone | 1 | — | — |
| ,,-trichloro-4'-t-butyl acetophenone | — | 1 | 1 |
| No. 2 Zahn cup viscosity, sec. | 217.4 | 171.1 | 106.8 |
| Film properties | | | |
| Tensile strength, p.s.i. | 4,135 | 3,054 | 1,763 |
| Elongation, % | 53 | 88 | 93 |

*Produced by first reacting 1 mol. part of a tetrafunctional poly-epsilon-caprolactone polyol (m. wt. 909, ave. OH no. 247, acid no. 0.185) with 6 mol. parts isophorone diisocyanate; then reacting the product thus formed with 3 mol. parts of 2-hydroxyethylacrylate. Contains 30 wt. % MCEA, which was the reaction solvent.

Example 6

| Formulation, | Weight percent | |
|---|---|---|
| | A | B |
| Urethane acrylyl oligomer* | 60 | 60 |
| MCEA | 15 | 20 |
| 2-ethylhexyl acrylate | 8.7 | 8.7 |
| 2,2-diethoxyacetophenone | 1 | 1 |
| Silicone slip additive | 0.3 | 0.3 |
| Crosslinker** | 10 | 10 |
| Tetraethylorthosilicate | 5 | — |
| Brookfield viscosity, cps. (23° C.) | 1,280 | 4,300 |
| Film properties | | |
| Tensile strength, p.s.i. | 1,251 | 4,877 |
| Elongation, % | 50 | 10 |

*Produced by first reacting 1 mol. part of a difunctional poly-epsilon-caprolactone polyol (m. wt. 540, average OH no. 310, acid no. 0.25) with 3 moles of isophorone diisocyanate; and then reacting the product thus produced with a mixture of 2.2 mol. parts of 2-hydroxyethyl acrylate and 0.8 mol. parts of 2-ethylhexanol.

Example 7

| Formulation | Weight percent | |
|---|---|---|
| | A | B |
| Urethane acrylyl oligomer | 60 | 60 |
| MCEA | 25 | 15 |
| 2,2-di-sec-butoxyacetophenone | 1 | 1 |
| N-vinyl pyrrolidone | 6 | 6 |
| Crosslinker** | 8 | 8 |
| Tetraethylorthosilicate | — | 10 |
| Brookfield viscosity, cps. (23° C.) | 17,640 | 8,700 |
| Film properties | | |
| Scrub test, % gloss retained | 47 | 49 |
| Frick Taber abrasion, grams | .0611 | .0631 |
| Tensile strength p.s.i. | 6,063 | 2,760 |
| Elongation, % | 10 | 46 |

*Produced by first reacting 1 mol. part of a difunctional poly-epsilon-caprolactone polyol (m. wt. 540, avge. OH no. 310, acid no. 0.25) with 3 mol. parts of 4,4'-methylene-bis(cyclohexylisocyanate); then reacting the product thus obtained with 3 mol. parts of 2-hydroxyethyl acrylate. Contains 15 wt. % isodecyl acrylate and 20 wt. % MCEA, which were reaction solvents.
**Reaction product of 1 mol. part isophorone diisocyanate and 2 mol. parts 2-hydroxyethyl acrylate.

Example 8

| Formulation | Weight percent | |
|---|---|---|
| | A | B |
| Urethane acrylyl oligomer[1] | 70 | 70 |
| 2,2-di-sec-butoxyacetophenone | 1 | 1 |
| Crosslinker A[2] | 7 | 7 |
| Crosslinker B[3] | 7 | 7 |
| MCEA | 10 | 10 |
| Phenoxyethyl acrylate | 5 | — |
| Tetraethylorthosilicate | — | 5 |
| Brookfield viscosity, cps. (23° C.) | 6,000 | 4,520 |

--- composition Aged 5 days, room temp.

| | | | | | |
|---|---|---|---|---|---|
| Stiffness modulus, p.s.i. | 120,897 | 109,250 | 114,408 | 100,222 | 108,265 |
| Tensile strength, p.s.i. | 2,095 | 2,800 | 2,972 | 2,931 | 2,833 |
| Elongation, % | 2.0 | 4.0 | 3.0 | 5.0 | 4.0 |
| Aged 5 days, 65° C. | | | | | |
| Stiffness modulus, p.s.i. | 96,210 | 113,003 | 108,161 | 103,472 | 103,193 |
| Tensile strength, p.s.i. | 2,776 | 3,106 | 2,962 | 3,157 | 3,209 |
| Elongation, % | 4.0 | 5.0 | 4.0 | 5.0 | 6.0 |

EXAMPLE 4

The following radiation curable coating composition of the prior art, was used as a base coating composition in this example:

| | Weight % |
|---|---|
| Urethane acrylyl oligomer* | 50.0 |
| MCEA | 43.0 |
| 2-ethylhexyl acrylate | 5.8 |
| Silicone slip additive | 0.3 |
| 2,2-diethoxyacetophenone | 0.9 |

*Prepared by reacting 1 mol. part of a difunctional poly-epsilon-caprolactone polyol (average OH No. 212, average m. wt. 530), 2 mol. parts isophorone diisocyanate, and 2 mol. parts 2-hydroxyethyl acrylate. Oligomer contains 20 wt. % MCEA, which was the reaction solvent.

A series of three coating compositions were then prepared by mixing the base coating composition with the components indicated below. The composition had to be heated to 50° C. to dissolve the photoinitiator. Each of the coating compositions was applied to release paper at a thickness of 2.2 mil with a No. 40 wire wound rod. The coatings on the release paper were cured in a manner similar to that employed in Example 2, with nitrogen blanketing at 15 p.s.i. Brookfield viscosities of the uncured coating compositions and tensile properties of the cured coatings are given below. It can be seen that both tetraethylorthosilicate and tetraethyoxyethylorthosilicate substantially reduced the viscosity of the coating compositions. The cured coating containing tetraethylorthosilicate had somewhat higher tensile strength than the coating containing no orthosilicate compound, while the cured coating containing tetraethoxyethylorthosilicate had a somewhat lower tensile strength. In each example, the coating compositions were prepared by mixing to a uniform composition the components listed in the table below. Each composition was applied to a substrate (release paper in Examples 5 and 6, Bonderite steel in Examples 7 and 8) and cured by a procedure similar to that used in Example 2.

| | Parts by weight | | |
|---|---|---|---|
| | A | B | C |
| Base coating composition | 80 | 80 | 100 |
| Tetraethoxyethyl-orthosilicate | 20 | — | — |
| Tetraethylorthosilicate | — | 20 | — |
| Photoinitiator* | 2 | 2 | 2 |

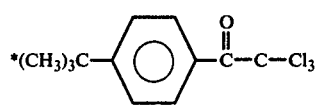

| | Cured | Uncured |
|---|---|---|
| Tensile strength, p.s.i. | Elongation % | Viscosity, cps. (23° C.) |
| A | 1,088 | 108 | 240 |
| B | 2,222 | 116 | 110 |

-continued

| Film properties | | |
|---|---|---|
| Scrub test, % gloss retained | 48.3 | 546 |
| Frick taber abrasion, grams | .0204 | .0133 |
| Tensile strength, p.s.i. | 2,409 | 1,276 |
| Elongation, % | 89 | 77 |

[1] Produced by first reacting 2 mol. parts of a difunctional poly-epsilon-caprolactone polyol (m. wt. 530, avge. OH no. 212, acid no. 0.25), and 1 mol. part of a trifunctional poly-epsilon-caprolactone polyol (m. wt. 900), avge. OH no. 187, acid no. 0.25) with 5 mol. parts of 4,4'-methylene-bis-(cyclohexylisocyanate); then reacting the product thus obtained with 3 mol. parts 2-hydroxyethyl acrylate. Contains 30 wt. % MCEA and 10 wt. % isodecyl acrylate, which were reaction solvents.
[2] 3'-acryloxy-2',2'-dimethylpropyl 3-acryloxy-2,2,-dimethylpropionate.
[3] Reaction product of 1 mol. parts isophorone diisocyanate and 2 mol. part 2-hydroxyethyl acrylate.

In all the foregoing examples it was observed that the uncured coating compositions containing tetraethylorthosilicate or tetraethoxyethylorthosilicate as a diluent appeared to exhibit generally superior flow and leveling characteristics in their application to substrates by comparison to corresponding formulations containing no tetraethylorthosilicate or tetraethoxyethylorthosilicate.

What is claimed is:

1. In the process of coating a substrate wherein a radiation curable coating composition containing an acrylyl oligomer is applied to the substrate and then cured by exposure to radiation, the improvement which comprises admixing with the radiation curable coating composition, prior to applying it to the substrate, a diluent chosen from the group consisting of tetraethylorthosilicate and tetraethoxyethylorthosilicate, the concentration of said diluent being from 1 to 50 weight percent, based on the weight of radiation curable coating composition and diluent.

2. An improvement as claimed in claim 1, wherein said diluent is employed at a concentration of from 1 to 15 weight percent, based on the weight of radiation curable coating composition and diluent.

3. An improvement as claimed in claim 1, wherein said acrylyl oligomer is a urethane oligomer characterized in that it has a molecular weight of from 1,000 to 10,000; contains at least one urethane group; and at least one acrylyl or methacrylyl group per molecule.

4. An improvement as claimed in claim 1, wherein said radiation curable coating composition, exclusive of the tetraethylorthosilicate or tetraethoxyorthosilicate, comprises:
(A) from 30 to 95 weight percent of a polyurethane acrylate oligomer, characterized in that it has a molecular weight of from 1,000 to 10,000, contains at least one urethane group, and contains an average of at least one acrylyl or methacrylyl group per molecule;
(B) from 0 to about 50 weight percent of a low molecular weight polyfunctional acrylate or methacrylate crosslinker;
(C) from 0 to 40 weight percent of a liquid monofunctional acrylate or methacrylate; and
(D) from 0 to 20 weight percent of a photoinitiator.

5. An improvement as claimed in claim 1, wherein said diluent is tetraethylorthosilicate.

6. An improvement as claimed in claim 1, wherein said diluent is tetraethoxyethylorthosilicate.

7. In a radiation curable coating composition containing an acrylyl oligomer, the improvement which comprises having present therein, as a diluent, a compound chosen from the group consisting of tetraethylorthosilicate and tetraethoxyethylorthosilicate.

8. An improved composition as claimed in claim 7, wherein said acrylyl oligomer is a urethane acrylate oligomer.

9. An improved composition as claimed in claim 8, wherein said urethane acrylate oligomer has a molecular weight of from 1,000 to 10,000, contains at least one urethane group, and at least one acrylyl or methacrylyl group per molecule.

10. An improved composition as claimed in claim 7, further comprising:
(A) from 30 to 95 weight percent of a urethane acrylate oligomer, characterized in that it has a molecular weight of from 1,000 to 10,000, contains at least one urethane group, and contains an average of at least one acrylyl or methacrylyl group per molecule;
(B) from 0 to 50 weight percent of a low molecular weight polyfunctional acrylate or methacrylate crosslinker;
(C) from 0 to 40 weight percent of a liquid monofunctional acrylate or methacrylate; and
(D) from 0 to 20 weight percent of a photoinitiator.

11. An improved composition as claimed in claim 7, wherein said diluent is tetraethylorthosilicate.

12. An improved composition as claimed in claim 7, wherein said diluent is tetraethyoxyethylorthosilicate.

* * * * *

UNITED STATES PATENT OFFICE
CERTIFICATE OF CORRECTION

Patent No. 4,143,013  Dated  March 6, 1979

Inventor(s) Richard D. Jenkinson, Charles H. Carder

It is certified that error appears in the above-identified patent and that said Letters Patent are hereby corrected as shown below:

In column 7, line 23, "Frick Taper" should read -- Frick Taber --.

In column 11, in the table the correct % gloss retained for composition B should read -- 54.6-- not "546".

Signed and Sealed this

Twenty-ninth Day of May 1979

[SEAL]

Attest:

RUTH C. MASON
Attesting Officer

DONALD W. BANNER
Commissioner of Patents and Trademarks